(12) United States Patent
Park et al.

(10) Patent No.: US 12,726,006 B2
(45) Date of Patent: Sep. 1, 2026

(54) SUBMODULE

(71) Applicant: HYOSUNG HEAVY INDUSTRIES CORPORATION, Seoul (KR)

(72) Inventors: Yong Hee Park, Anyang-si (KR); Nam Joon Ku, Anyang-si (KR); Ki Ryang Kwon, Seoul (KR); Jung Won Hong, Bucheon-si (KR); Hong Ju Jung, Seoul (KR)

(73) Assignee: HYOSUNG HEAVY INDUSTRIES CORPORATION, Seoul (KR)

( * ) Notice: Subject to any disclaimer, the term of this patent is extended or adjusted under 35 U.S.C. 154(b) by 146 days.

(21) Appl. No.: 18/569,200

(22) PCT Filed: Nov. 17, 2022

(86) PCT No.: PCT/KR2022/018186
§ 371 (c)(1),
(2) Date: Dec. 11, 2023

(87) PCT Pub. No.: WO2023/113264
PCT Pub. Date: Jun. 22, 2023

(65) Prior Publication Data

US 2024/0276683 A1 Aug. 15, 2024

(30) Foreign Application Priority Data

Dec. 17, 2021 (KR) ........................ 10-2021-0182004

(51) Int. Cl.

| | |
|---|---|
| ***H02B 1/56*** | (2006.01) |
| ***H05K 7/02*** | (2006.01) |
| *H02B 1/46* | (2006.01) |

(52) U.S. Cl.
CPC ............... *H02B 1/56* (2013.01); *H05K 7/023* (2013.01); *H02B 1/46* (2013.01)

(58) Field of Classification Search
None
See application file for complete search history.

(56) References Cited

U.S. PATENT DOCUMENTS

| | | | | |
|---|---|---|---|---|
| 9,414,523 | B2 * | 8/2016 | Chainer | H05K 7/20772 |
| 9,999,151 | B2 * | 6/2018 | Lindblom | H05K 7/20927 |
| 11,158,998 | B1 * | 10/2021 | Fonseca | H02B 1/56 |

(Continued)

FOREIGN PATENT DOCUMENTS

| | | |
|---|---|---|
| CN | 104460917 A | 3/2015 |
| EP | 0036384 A2 | 9/1981 |

(Continued)

*Primary Examiner* — Courtney L Smith
(74) *Attorney, Agent, or Firm* — NKL Law; Jae Youn Kim

(57) ABSTRACT

The present disclosure relates to a submodule. An enclosure 20 may form the exterior of the submodule 10 of the present disclosure. A first opening 25 may be formed on one side surface 24 of the enclosure 20. A heat sink 30 may be installed in the first opening 25. The inner surface of the heat sink 30 faces the inside of the enclosure 20, and the outer surface of the heat sink 30 may form one outer surface of the enclosure 20. A heating element such as a power semiconductor 32 or a control board may be installed on the heat sink 30. An inlet 34 and an outlet 36 may be provided at one side edge of the heat sink 30 to communicate with a flow path formed therein and allow cooling fluid to flow in and out.

3 Claims, 8 Drawing Sheets

(56) References Cited

U.S. PATENT DOCUMENTS

| | | | | |
|---|---|---|---|---|
| 11,246,244 | B2 * | 2/2022 | Denk | H05K 7/14329 |
| 11,973,325 | B2 * | 4/2024 | Rainbow | H05K 7/14324 |
| 2004/0246677 | A1 * | 12/2004 | Chen | H01L 23/427 257/E23.088 |
| 2005/0036292 | A1 * | 2/2005 | Chengalva | H01L 23/3677 257/E23.105 |
| 2005/0225942 | A1 * | 10/2005 | Lee | G06F 1/203 361/700 |
| 2006/0114655 | A1 * | 6/2006 | Wallace | H05K 7/20418 361/704 |
| 2009/0321130 | A1 * | 12/2009 | Greer, Jr. | H05K 7/20409 174/526 |
| 2011/0286183 | A1 * | 11/2011 | Chiu-Mao | H05K 7/20218 361/699 |
| 2020/0136326 | A1 * | 4/2020 | Rai | H01H 50/12 |
| 2021/0112680 | A1 * | 4/2021 | Rai | H05K 7/20254 |

FOREIGN PATENT DOCUMENTS

| | | | |
|---|---|---|---|
| EP | 0918452 | A1 | 5/1999 |
| EP | 2528091 | A2 | 11/2012 |
| JP | 05283582 | A | 10/1993 |
| JP | 2011160594 | A | 8/2011 |
| JP | 2014057485 | A | 3/2014 |
| KR | 1019910002080 | A | 1/1991 |
| KR | 100726003 | B1 | 6/2007 |
| KR | 101288679 | B1 | 7/2013 |
| KR | 101295070 | B1 | 8/2013 |
| KR | 20140003080 | A | 1/2014 |
| KR | 1020140003080 | A | 1/2014 |
| KR | 20150023204 | A | 3/2015 |
| KR | 20150075726 | A | 7/2015 |
| KR | 1020150075726 | A | 7/2015 |
| KR | 101623347 | B1 | 6/2016 |
| KR | 20160129696 | A | 11/2016 |
| KR | 102089892 | B1 | 3/2020 |
| KR | 20200124451 | A | 11/2020 |

* cited by examiner

SUBMODULE

TECHNICAL FIELD

The present disclosure relates to a submodule.

BACKGROUND ART

The High Voltage Direct Current (HVDC) system is a power transmission method that uses direct current (DC) for electric power transmission. A power transmitting station converts AC power generated at a power plant into DC power and transmits the power, and a power receiving station reconverts it into AC power to supply. This transmission method uses direct current (DC) at high voltage levels, which reduces the losses compared to alternating current (AC) methods. It also improves the stability by separating the grids and avoids the inductive interference that affects long-distance power transmission.

In such a very high voltage direct current transmission system, as shown in FIG. 1, a plurality of submodules 1 are installed in a frame 3 composed of a plurality of layers with a height of several meters. In the frame 3, a plurality of partition plates 7 are installed to form a plurality of layers in a plurality of vertically installed columns 5. A plurality of submodules 1 are installed in rows on the partition plate 7.

The submodule used in this system consist of a power supply unit 9 and a capacitor unit 9', and various power semiconductors and various control boards are installed in the power supply unit 9. The power semiconductor and control boards installed in the power supply unit 9 generate a lot of heat during operation. In order to dissipate this heat to the outside, a heat dissipating device using cooling water is connected from the outside to the inside of the power supply unit 9. That is, there is a pipe for supplying cooling water to the inside of the power supply unit 9, which delivers the cooling water to a heat sink installed inside the power supply unit 9.

In such a configuration, when cooling water leaks inside the submodule, it causes a short circuit or corrosion, and in severe cases, damages to power semiconductors or control boards.

In addition, since many parts, including a heat dissipating device, are installed inside the power supply unit 9, the size of the sub module 1 increases and the size of the frame 3 for installing the sub module 1 increases, taking up a lot of space.

Such a submodule 1 is used in a similar form not only in a High Voltage Direct Current system (HVDC system) but also in a Flexible Alternative Current Transmission system (FACT system) in which power semiconductors are used.

Prior arts related to the submodule described above include Korean Patent Registration No. 10-1623347, Korean Patent Registration No. 10-1295070, and Korean Patent Registration No. 10-1288679.

DISCLOSURE

Technical Problem

An object of the present disclosure is to reduce a size of a submodule.

An object of the present disclosure is to prevent cooling water from entering the inside of a submodule.

An object of the present disclosure is to simplify a connection structure between submodules.

An object of the present disclosure is to facilitate heat dissipation to the outside while reducing a size of a submodule.

Technical Solution

A submodule of the present disclosure for achieving the above objects comprises: an enclosure in which parts are installed, and an opening is formed on one outer surface thereof; and a heat sink installed in the opening of the enclosure, having an inner surface inside the enclosure on which at least one of the parts installed, and the other surface being outside the enclosure.

The opening may be formed in one of side plates of the enclosure to install the heat sink.

The opening may be formed on a top plate of the enclosure to install the heat sink.

The opening may be formed on a bottom plate of the enclosure to install the heat sink.

A flow path through which cooling fluid flows is formed inside the heat sink, and the flow path may communicate with the outside through an inlet and an outlet installed at one side of the heat sink.

A first terminal and a second terminal may be provided on the front plate of the enclosure to electrically connect to adjacent submodules.

A first terminal for electrical connection with an adjacent submodule may be provided on the front plate of the enclosure, and a second terminal may be provided on the heat sink.

According to another feature of the present disclosure, a submodule comprises: an enclosure having a hexahedral shape in which parts are installed therein and an opening is formed on one outer surface thereof; and a heat sink installed in the opening of the enclosure, having an inner surface inside the enclosure on which at least one of the parts is installed, and the other surface is outside the enclosure. A flow path through which cooling fluid flows is formed inside the heat sink, and the flow path may communicate with the outside through an inlet and an outlet installed at one side of the heat sink.

The opening may be formed in any one of a top plate, a side plate, and a bottom plate of the enclosure, and the heat sink may be installed to cover the opening to form one outer surface of the enclosure.

A first terminal and a second terminal may be provided on a front plate of the enclosure to electrically connect to adjacent submodules.

The first terminal for electrical connection with an adjacent submodule may be provided on the front plate of the enclosure, and the second terminal for electrical connection with an adjacent submodule may be provided on the heat sink.

Advantageous Effects

The submodule according to the present disclosure may have at least one or more of the following effects.

In the present disclosure, a heat sink may constitute one surface of an enclosure constituting an exterior of a submodule. Therefore, since the heat sink constitutes one surface of the enclosure and does not occupy space inside the enclosure, space for installing the heat sink inside the enclosure of the submodule is not required, and the size of the enclosure may be reduced.

In the present disclosure, the heat sink constitutes one outer surface of the enclosure, and one surface of the heat sink faces the inside of the enclosure and the other surface thereof is exposed to the outside of the enclosure. In addition, an inlet and an outlet for cooling fluid flowing in and out of the heat sink may be positioned on one side of the heat sink constituting one outer surface of the enclosure. This structure ensures that the cooling fluid does not enter the inside of the enclosure and does not affect parts installed inside the enclosure.

In the present disclosure, the heat sink may be formed an outer surface of one side of the enclosure and the outer surface of the heat sink may be exposed to the outside. This means that heat may be dissipated more efficiently in the heat sink because heat exchange with the outside air may be performed more easily.

Meanwhile, in another embodiment of the present disclosure, a terminal for coupling a bus bar connecting adjacent submodules may be placed on the heat sink. This configuration allows the terminal to be integrally placed on one side of the heat sink, thereby reducing the number of parts as a whole.

DETAILED DESCRIPTION OF THE DISCLOSURE

Figure 1:
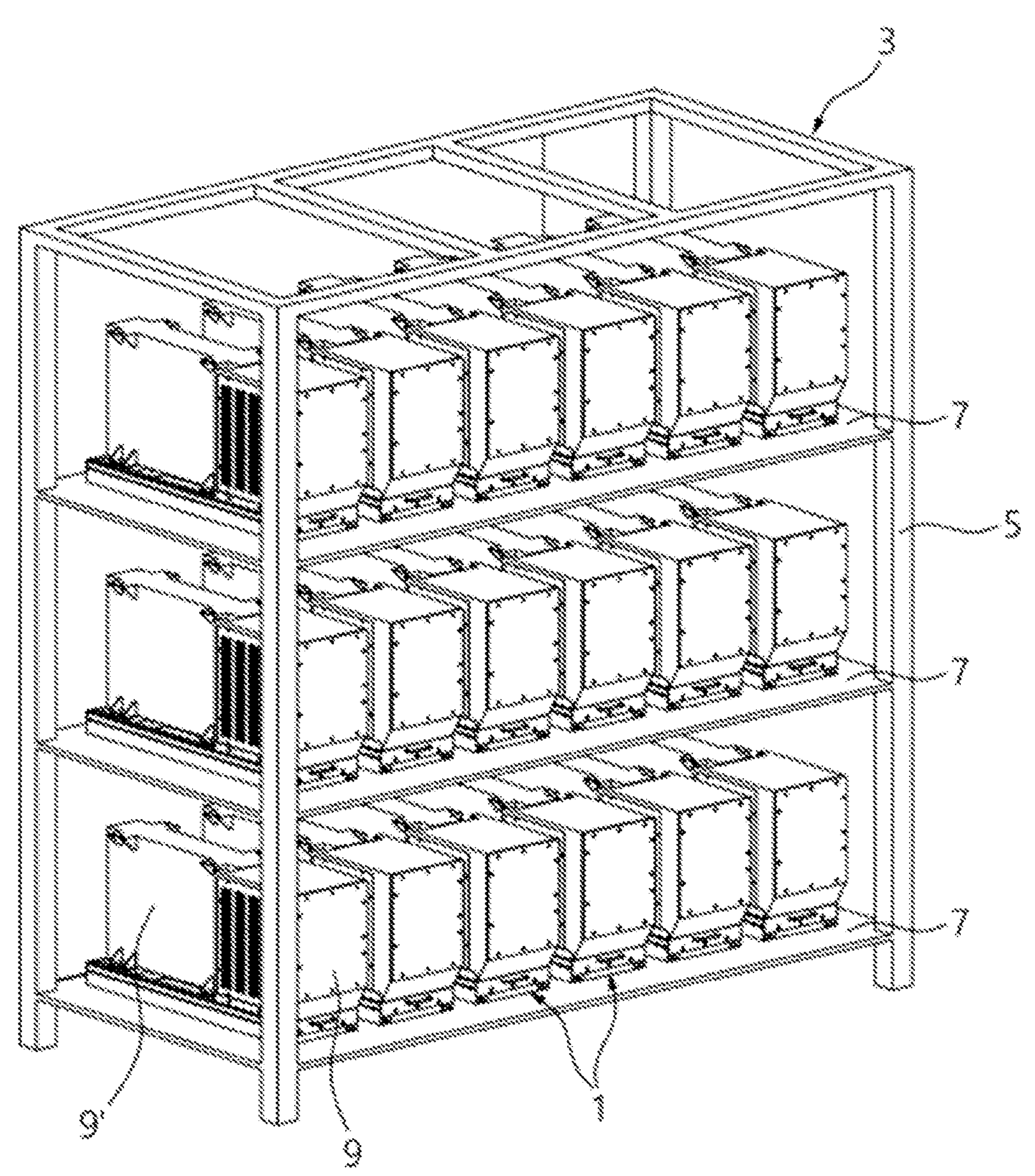
FIG. 1 is a perspective view showing an installation state of a general submodule.

Hereinafter, some embodiments of the present disclosure will be described in detail with reference to exemplary drawings. In assigning reference numerals to the components of each drawing, it should be noted that the same components are given the same reference numerals as much as possible even though the same components are indicated on different drawings. In addition, in describing the embodiment of the present disclosure, if it is determined that a detailed description of a related known configuration or function interferes with the understanding of the embodiment of the present disclosure, the detailed description thereof will be omitted.

In addition, in describing the components of the embodiment of the present disclosure, terms such as first, second, A, B, (a), (b), etc. may be used. These terms are only used to distinguish between the components, and the nature, or order of the components are not limited by the terms. When a component is described as being "combined with", "coupled to" or "connected to" another component, the component may be directly connected to or combined with each other, but it should be understood that another component may be "connected to", "coupled to" or "combined with" each of the components therebetween.

Hereinafter, a configuration of a preferred embodiment of the present disclosure will be described in detail with reference to the accompanying drawings.

Figure 2:
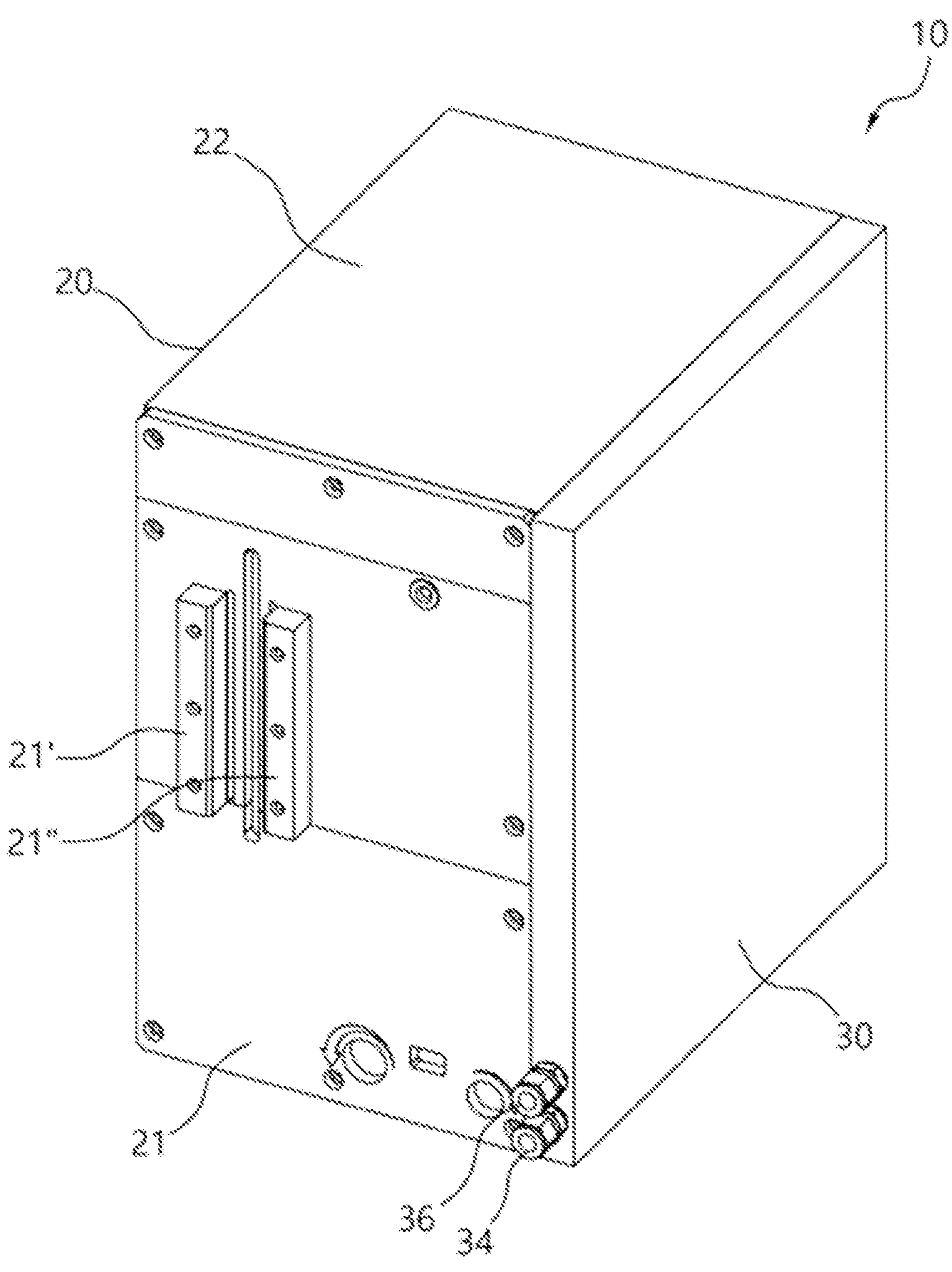
FIG. 2 is a perspective view showing a configuration of a preferred embodiment of a submodule according to the present disclosure.
Figure 3:
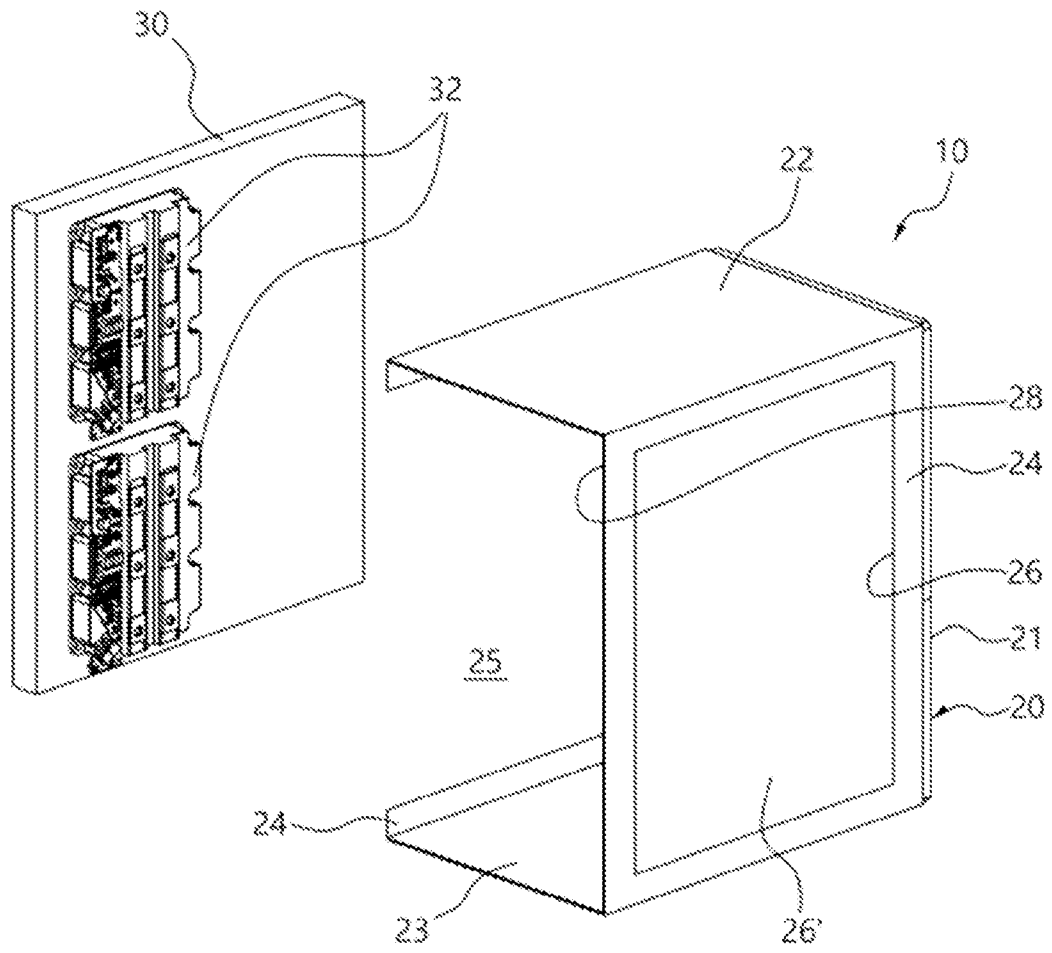
FIG. 3 is an exploded perspective view showing the configuration of the embodiment shown in FIG. 2.

FIGS. 2 and 3 shows a configuration of a submodule of the preferred embodiment of the present disclosure. An enclosure 20 may form an exterior of a submodule 10 of the present disclosure. The enclosure 20 forms the exterior of the submodule 20 and has a space therein where various parts may be installed. The enclosure 20 may have a hexahedral shape.

A front plate 21 may form the front surface of the enclosure 20. A first terminal 21' and a second terminal 21" may be provided on the front plate 21. The first terminal 21' and the second terminal 21" may be electrically connected to the parts inside the enclosure 20. The first terminal 21' and the second terminal 21" may also be electrically connected to an adjacent submodule 10 through a connecting bus bar 40 (see FIG. 5). The front plate 21 may have configurations for external connection of the submodule 10 as well as configurations for manipulating the submodule 10.

A top plate 22 may form an upper surface of the enclosure 20. The top plate 22 may be connected to an upper end of the front plate 21. The top plate 22 has a rectangular shape in this embodiment. However, the top plate 22 may have a different shape depending on the configuration of the enclosure 20. On the opposite side of the top plate 22, there may be a bottom plate 23. The bottom plate 23 may form the bottom of the enclosure 20. The bottom plate 23 may have the same shape and area as the top plate 22.

Side plates 24 may be provided at both ends of the top plate 22 and the bottom plate 23 in the width direction. The side plates 24 may form both sides of the enclosure 20. One of the side plates 24 may have a first opening 25. The first opening 25 may allow the inside and outside of the enclosure 20 to communicate. In this embodiment, a heat sink 30 to be described below may be installed to cover the first opening 25. The first opening 25 may be formed over the whole area or partial area of the side plate 24. In the illustrated embodiment, the opening 25 is formed over the whole area of the side plate 24.

The other one of the side plate 24 may have a second opening 26. The second opening 26 is a part that an operator may access to the inside of the enclosure 20 for maintenance. The second opening 26 may be shielded by a cover 26'. In this embodiment, the second opening 26 is formed over the whole area of the side plate 24. However, the second opening 26 may have an area and shape required for access to the inside of the enclosure 20. Although not shown in the drawing, a plurality of louvers may be formed in the cover 26' to allow air to flow between the inside and outside of the enclosure 20.

A third opening 28 may be formed on the rear surface of the enclosure 20 opposite to the front plate 21 in the enclosure 20. The third opening 28 may be formed over the whole area of the rear surface of the enclosure 20. However, the third opening 28 need not necessarily be formed over the whole rear surface of the enclosure 20. The third opening 28 may be formed only on a partial area of the rear surface of the enclosure 20. Through the third opening 28, a capacitor unit (not shown) and the parts inside the enclosure 20 may be connected.

A heat sink 30 may be installed in the enclosure 20 to cover the first opening 25. The heat sink 30 may serve to discharge heat generated from the parts inside the enclosure 20 to the outside. The heat sink 30 may be made of a metal material. A power semiconductor 32 inside the enclosure 20 may be installed on an inner surface of the heat sink 30. An example of the power semiconductor 32 may be an IGBT. A control board (not shown) positioned inside the enclosure 20 may also be installed on the heat sink 30. Heating elements including the power semiconductor 32 may be installed on an inner surface of the heat sink 30. Of course, the heating elements may be located inside the enclosure 20 instead of the heat sink 30.

One surface of the heat sink 30 faces the inside of the enclosure 20, and the other surface thereof is positioned outside of the enclosure 20 to be in contact with external air. Accordingly, the heat sink 30 may discharge heat generated inside the enclosure 20 to the outside of the enclosure 20.

Meanwhile, an inlet 34 and an outlet 36 may be installed in the heat sink 30, as shown in FIG. 2. The inlet 34 and the outlet 36 transfer a cooling fluid such as cooling water. A pipe (not shown) supplying cooling fluid may be connected to the inlet 34 to transfer the cooling fluid to the inside of the heat sink 30. A pipe (not shown) may be connected to the outlet 36 to discharge the cooling fluid and transfer it to a configuration for heat dissipation.

A flow path (not shown) communicating with the inlet 34 and the outlet 36 may be formed inside the heat sink 30. Cooling fluid may flow through the flow path while absorbing heat generated inside the enclosure 20. The flow path may be formed in a zigzag pattern inside the heat sink 30 to evenly absorb heat over the entire area of the heat sink 30.

thickness of the heat sink 30 is relatively thicker than the thickness of the front plate 21, the top plate 22, the bottom plate 23, and the side plate 24 constituting the enclosure 20. This is to allow a flow path for cooling fluid to be formed inside the heat sink 30.

For reference, unlike the embodiment shown in FIGS. 2 and 3, the heat sink 30 may be installed on the opposite side of the enclosure 20. In this case, the cover 26' may be installed in the first opening 25.

Figure 4:
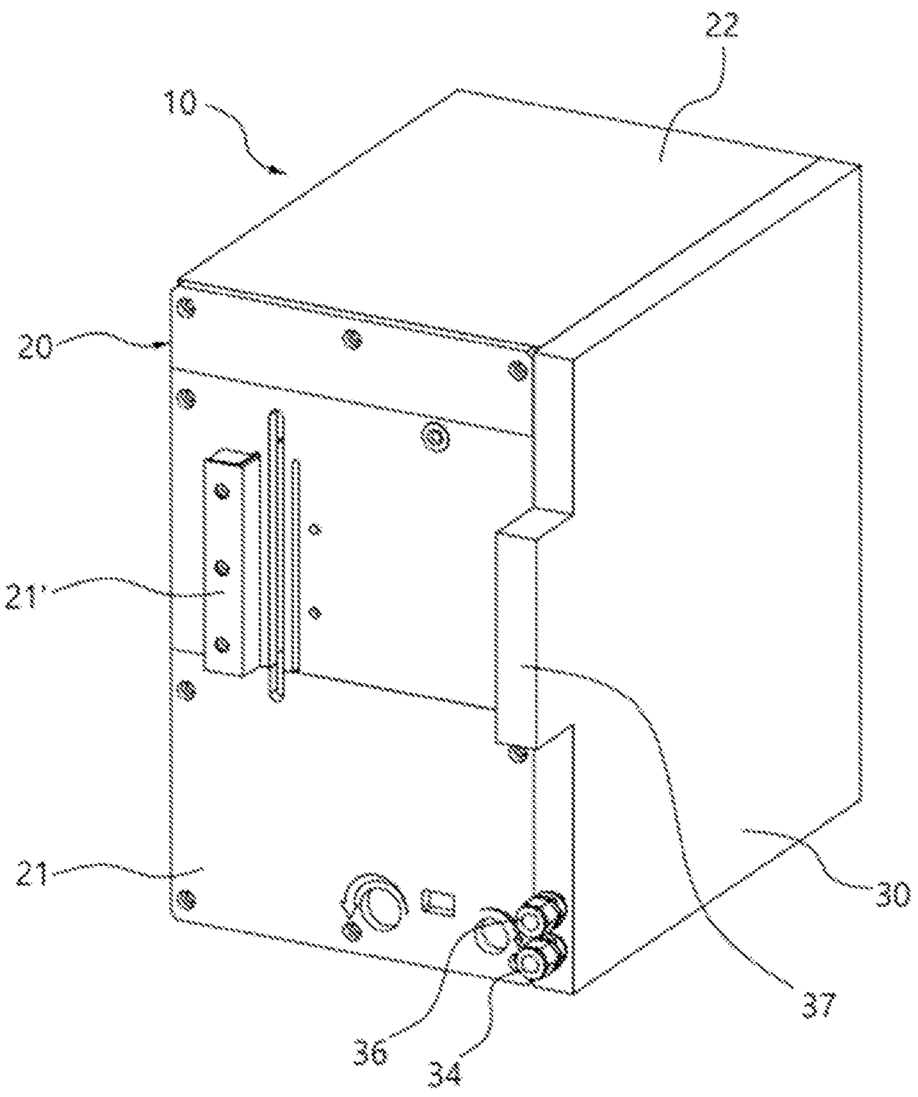
FIG. 4 is a perspective view showing a configuration of another embodiment of a submodule according to the present disclosure.
Figure 5:
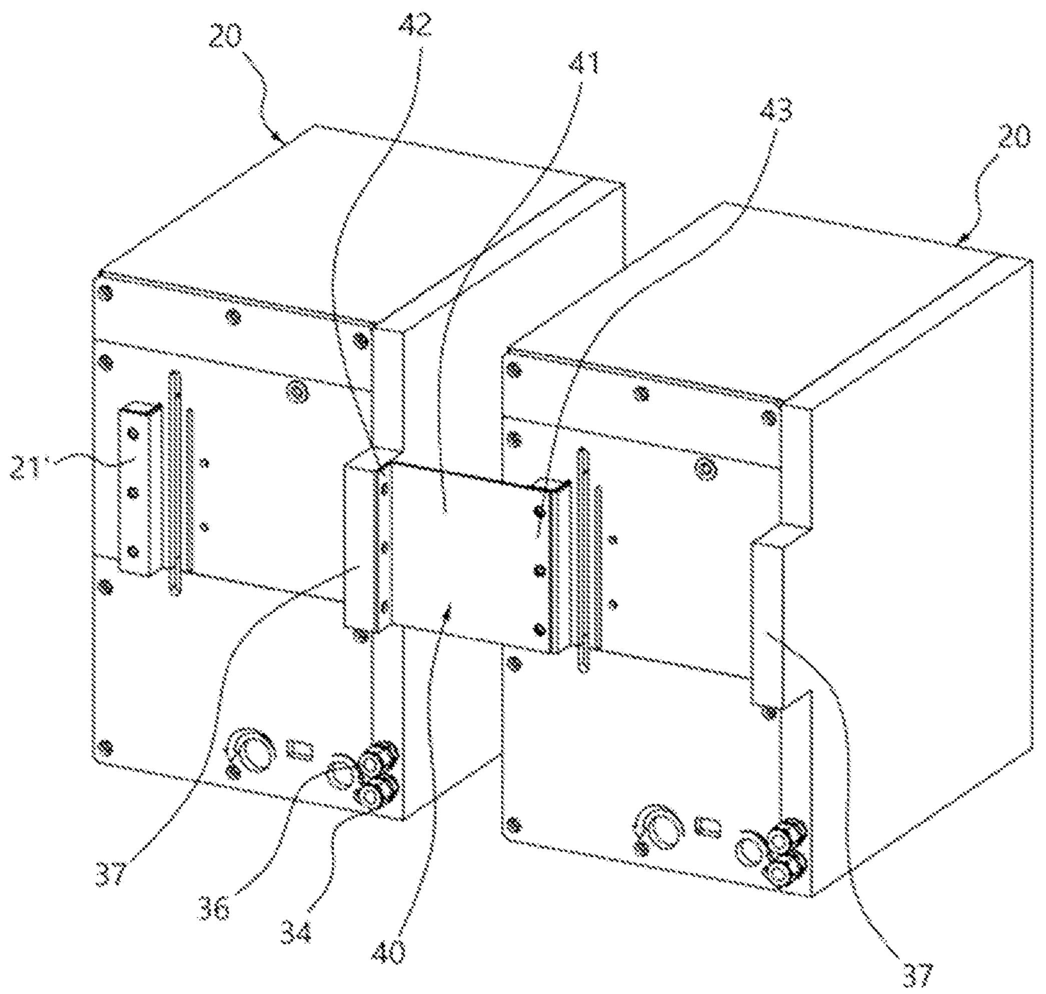
FIG. 5 is a perspective view showing that the embodiment shown in FIG. 4 is used.

Meanwhile, another embodiment of the present disclosure is shown in FIGS. 4 and 5. The overall configuration of the embodiment shown in FIGS. 4 and 5 is similar to that shown in FIG. 2. Therefore, for convenience of description, the same reference numerals are assigned to the same configurations as those of the embodiment shown in FIG. 2.

In this embodiment, a first terminal 21' may be installed on the front plate 21 constituting the front surface of the enclosure 20. In this embodiment, a second terminal 37 may be provided on the heat sink 30 installed on the outer surface of the enclosure 20. The second terminal 37 may be integrally formed on one side of the heat sink 30.

In this embodiment, the second terminal 37 may be located at a predetermined height of the front edge of the heat sink 30 corresponding to the same height as the first terminal 21'. The first terminal 21' and the second terminal 37 may be located side by side at the same height from the bottom plate 23.

A state in which adjacent submodules 10 are electrically connected using the first terminal 21' and the second terminal 37 is shown in FIG. 5. According to this, the first terminal 21' and the second terminal 37 may be electrically connected by a connecting bus bar 40. The connecting bus bar 40 may be made of a metal plate. A bus bar body 41 may form the skeleton of the connecting bus bar 40. The bus bar body 41 may have a predetermined plate shape. In this embodiment, the bus bar body 41 is a rectangular plate. At both ends of the bus bar body 41, there may be a first coupling part 42 and a second coupling part 43 for coupling to the first terminal 21' and the second terminal 37. The first coupling part 42 and the second coupling part 43 may be coupled to the first terminal 21' and the second terminal 37 respectively by means of screws. The first coupling part 42 may be orthogonal to the bus bar body 41.

Figure 6:
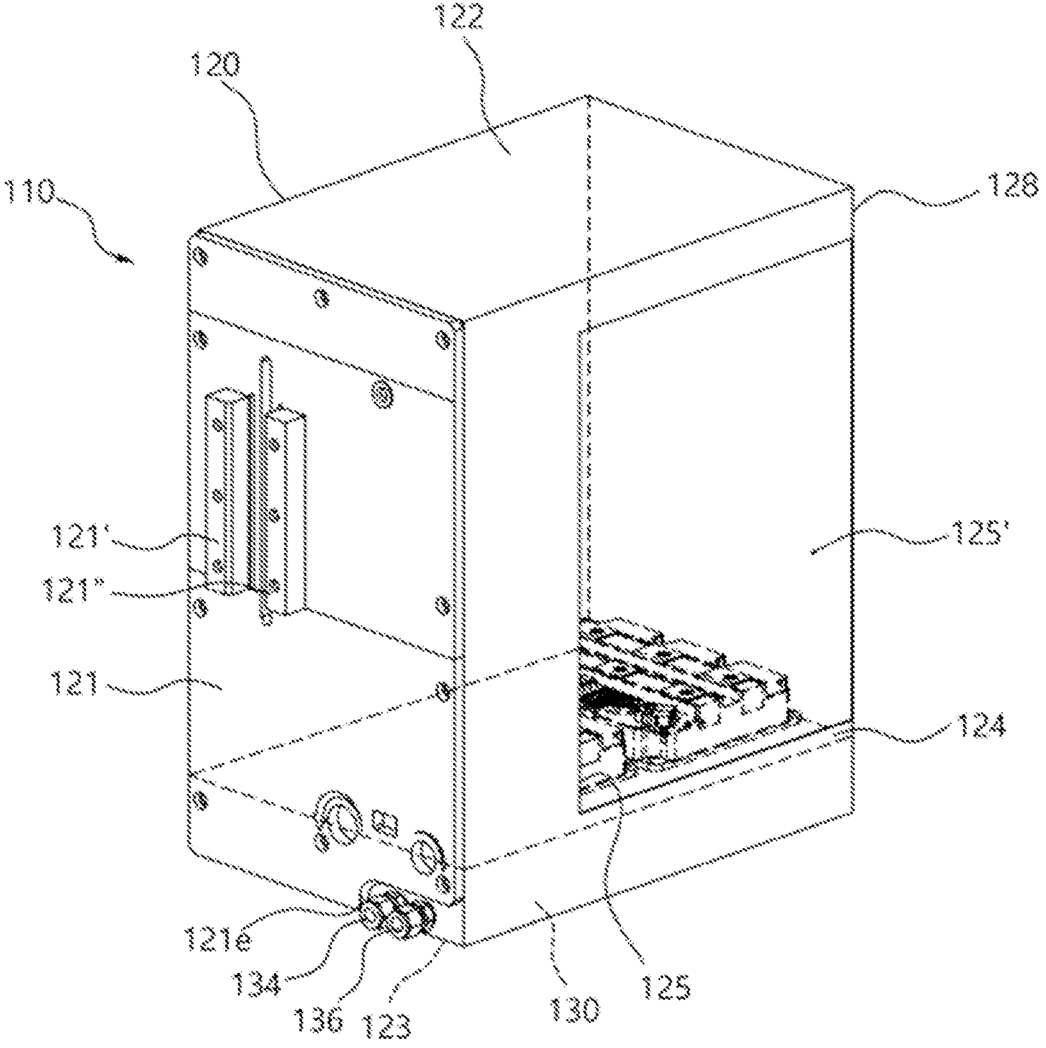
FIG. 6 is a one-way perspective view showing a configuration of another embodiment of a submodule according to the present disclosure.
Figure 7:
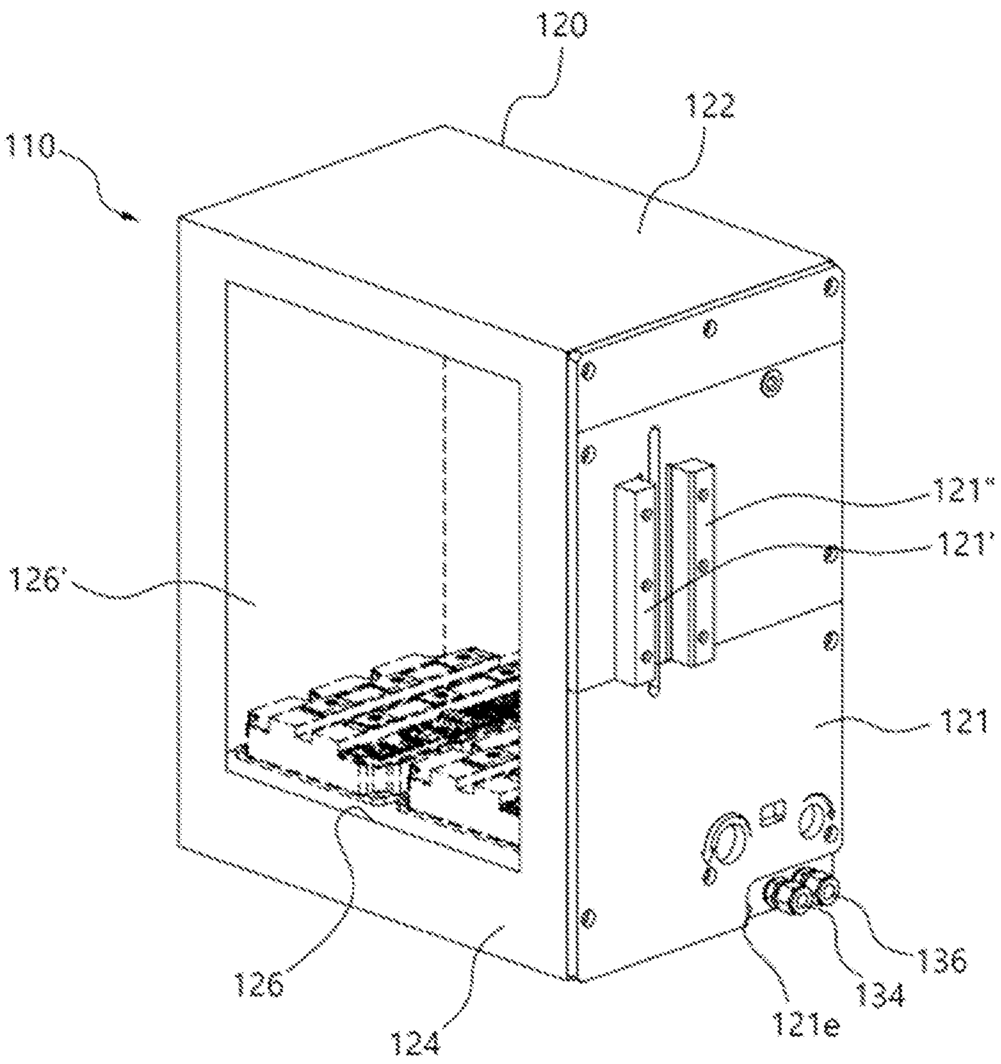
FIG. 7 is a perspective view of the embodiment shown in FIG. 6 from another direction.
Figure 8:
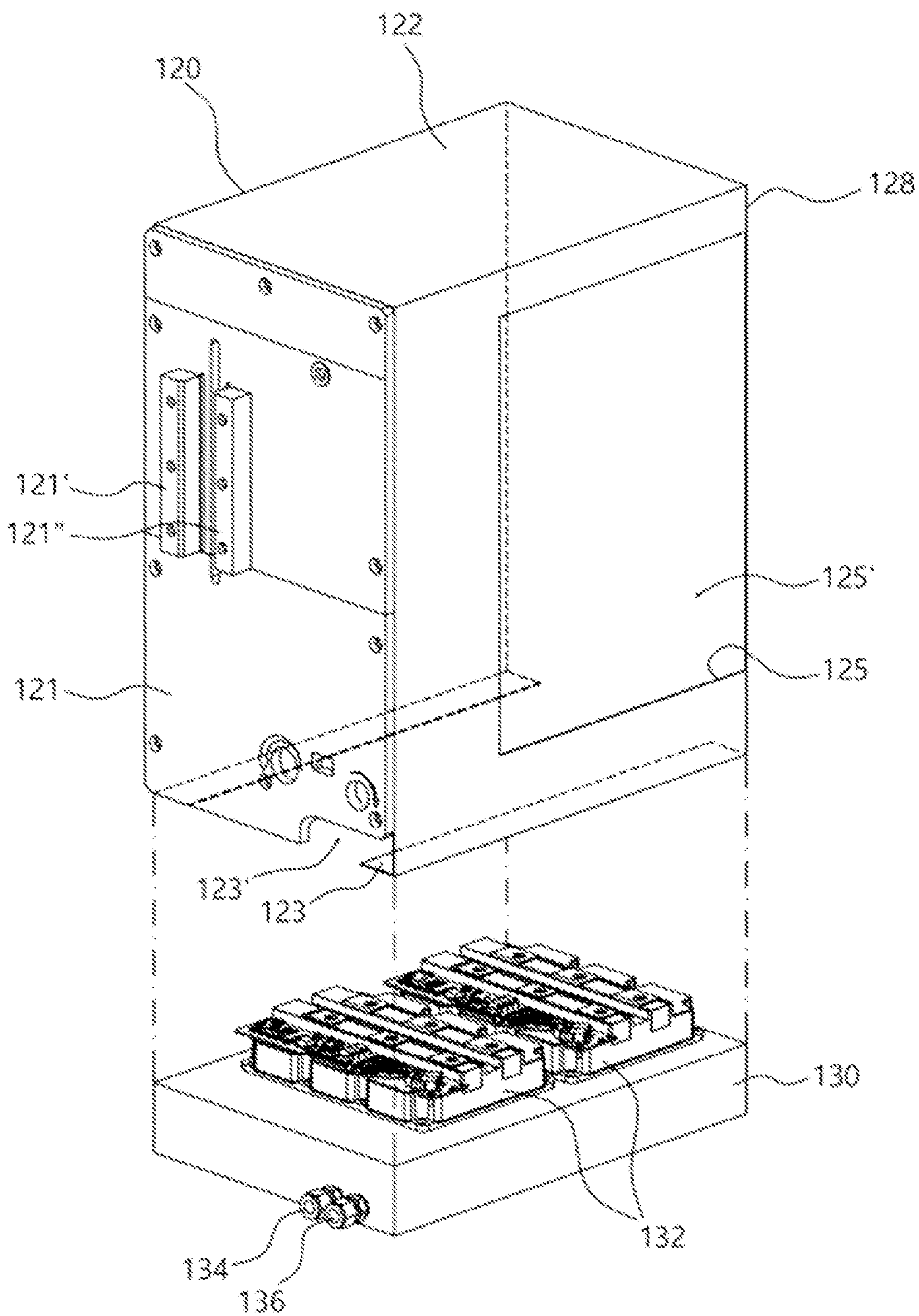
FIG. 8 is an exploded perspective view showing the configuration of the embodiment shown in FIG. 6.

FIGS. 6 to 8 show another embodiment of the present disclosure. In this embodiment, an enclosure 120 may form an exterior of a submodule 110. The enclosure 120 constitutes the exterior of the submodule 110 and has a space therein in which various parts may be installed. The enclosure 120 may have a hexahedral shape.

A front plate 121 may form the front surface of the enclosure 120. A first terminal 121' and a second terminal 121" may be provided on the front plate 121. The first terminal 121' and the second terminal 121" may be electrically connected to the parts inside the enclosure 120. The first terminal 121' and the second terminal 121" may also be electrically connected to an adjacent submodule 110 through a connecting bus bar 40 (see FIG. 5). The front plate 121 may have configurations for external connection of the submodule 110 as well as configurations for manipulating the submodule 110.

A top plate 122 may form an upper surface of the enclosure 120. The top plate 122 may be connected to an upper end of the front plate 121. The top plate 122 has a rectangular shape in this embodiment. However, the top plate 122 may have a different shape depending on the configuration of the enclosure 120. On the opposite side of the top plate 122, there may be a bottom plate 123. The bottom plate 123 may form the bottom of the enclosure 120. The bottom plate 123 may have the same shape and area as the top plate 122.

A bottom opening 123' may be formed in the bottom plate 123. The bottom opening 123' may be formed to occupy most of the area of the bottom plate 123. A heat sink 130 to be described below may be installed in the bottom opening 123' of the bottom plate 123.

Side plates 124 may be provided at both ends of the top plate 122 and the bottom plate 123 in the width direction. The side plates 124 may form both sides of the enclosure 120. One of the side plates 124 may have a first opening 125. The first opening 125 may allow the inside and outside of the enclosure 120 to communicate. In this embodiment, a heat sink 30 to be described below may be installed to cover the first opening 125. The first opening 125 may be formed over the whole area or partial area of the side plate 124. In the illustrated embodiment, the opening 125 is formed over the whole area of the side plate 124. Through the first opening 125, an operator may access the inside of the enclosure 120 for maintenance. The first opening 125 may have an area and shape required for an operator to access the inside of the enclosure 120.

A first cover 125' may be installed in the first opening 125. The first cover 125' covers the first opening 125 so that the inner space of the enclosure 120 is not visible from the outside. A plurality of louvers may also be formed in the first cover 125'.

The other one of the side plate 124 may have a second opening 126. The second opening 126 is a part that an operator may access to the inside of the enclosure 120 for maintenance. The second opening 126 may be shielded by a cover 126'. In this embodiment, the second opening 126 is formed over the whole area of the side plate 124. However, the second opening 126 may have an area and shape required for access to the inside of the enclosure 120. Although not shown in the drawing, a plurality of louvers may be formed in the cover 126' to allow air to flow between the inside and outside of the enclosure 120.

For reference, the presence of both the first opening 125 and the second opening 126 are not necessary. Either one of the first opening 125 or the second opening 126 may be absent.

A third opening 128 may be formed on the rear surface of the enclosure 120 opposite to the front plate 121 in the enclosure 120. The third opening 128 may be formed over the whole area of the rear surface of the enclosure 120. However, the third opening 28 need not necessarily be formed over the whole rear surface of the enclosure 120. The third opening 28 may be formed only on a partial area of the rear surface of the enclosure 120. Through the third opening 128, a capacitor unit (not shown) and the parts inside the enclosure 120 may be connected.

A heat sink 130 may be installed in the enclosure 120 to cover the bottom opening 123'. The heat sink 130 may serve to discharge heat generated from the parts inside the enclosure 120 to the outside. The heat sink 130 may be made of a metal material. A power semiconductor 132 inside the enclosure 20 may be installed on an inner surface of the heat sink 130. An example of the power semiconductor 132 may be an IGBT. A control board (not shown) positioned inside the enclosure 120 may also be installed on the heat sink 130. Heating elements including the power semiconductor 132 may be installed on an inner surface of the heat sink 30. Of course, the heating elements may be located inside the enclosure 120 instead of the heat sink 130.

One surface of the heat sink 130 faces the inside of the enclosure 120, and the other surface thereof is positioned outside of the enclosure 120 to be in contact with external air. Accordingly, the heat sink 130 may discharge heat generated inside the enclosure 120 to the outside of the enclosure 120.

Meanwhile, an inlet 134 and an outlet 136 may be installed in the heat sink 130, as shown in FIG. 6. The inlet 134 and the outlet 136 transfer a cooling fluid such as cooling water. A pipe (not shown) supplying cooling fluid may be connected to the inlet 134 to transfer the cooling fluid to the inside of the heat sink 130. A pipe (not shown) may be connected to the outlet 136 to discharge the cooling fluid and transfer it to a configuration for heat dissipation.

A flow path (not shown) communicating with the inlet 134 and the outlet 136 may be formed inside the heat sink 130. Cooling fluid may flow through the flow path while absorbing heat generated inside the enclosure 120. The flow path may be formed in a zigzag pattern inside the heat sink 130 to evenly absorb heat over the entire area of the heat sink 130.

The thickness of the heat sink 130 is relatively thicker than the thickness of the front plate 121, the top plate 122, the bottom plate 123, and the side plate 124 constituting the enclosure 120. This is to allow a flow path for cooling fluid to be formed inside the heat sink 130.

An opening 121*e* may be formed at one side of the front plate 121 in order to prevent the inlet 134 and the outlet 136 of the heat sink 130 from interfering with the front plate 121. The opening 121*e* may be made by partially removing a lower edge of the front plate 121.

Hereinafter, the use of the submodule according to the present disclosure having the above configuration will be described.

In the submodules 10 or 110 according to the present disclosure, the heat sinks 30 or 130 may be installed to be exposed on an outer surface of the enclosures 20 or 120. That is, the heat sink 30 or 130 may be installed on any one of the side plates 24 of the enclosure 20 or the bottom plate 123 of the enclosure 120. In addition, although not shown in the drawings, an opening may be formed in the top plate 22 or 122 of the enclosure 20 or 120 and the heat sink 30 or 130 may be installed therein. Alternatively, an opening may be formed in the front plate 21 or 121 and the heat sinks 30 or 130 may be installed therein.

A plurality of the submodules 10 or 110 configured as described above are installed side by side on a partition plate forming a plurality of layers in a frame, and adjacent submodules 10 or 110 may be connected and used by a connecting bus bar 40.

When the submodule 10 or 110 are in use, heat is generated in the power semiconductor 32 or 132, and it is necessary to dissipate the heat to the outside of the submodule 10 or 110. In the present disclosure, heat generated in the power semiconductors 32 or 132 may be conducted to the heat sink 30 or 130, one surface of which is exposed to the outside of the submodule 10 or 110, and the heat may be delivered to the cooling fluid flowing inside the heat sink 30 or 130. Of course, heat may also be radiated to the outside air through the outer surfaces of the heat sink 30 or 130.

Cooling fluid flows into and out of the heat sink 30 or 130 through the inlet 34 or 134 and the outlet 36 or 136. In the present disclosure, the inlet 34 or 134 and the outlet 36 or 136 are connected to the heat sink 30 or 130 from the outside of the enclosures 20 or 120, with no access to the inside of the enclosures 20 or 120.

Therefore, the cooling fluid does not enter the inside of the enclosures 20 or 120, and the cooling fluid is not transferred to the parts inside the enclosures 20 or 120 due to leakage of the cooling fluid.

Meanwhile, as shown in FIG. 5, when the second terminal 37 is placed on the heat sink 30, only the first terminal 21' may be installed on the front plate 21. That is, there is no need to install additional the second terminal 21" on the front plate 21, and the second terminal 37 integrally provided on the heat sink 30 is used to connect the adjacent submodule 10. When the second terminal 37 is integrally formed with the heat sink 30, the number of the parts may be relatively reduced.

Even though it has been described that all components constituting the embodiments of the present disclosure are combined into one or operated in combination with each other, the present disclosure is not necessarily limited to the embodiments. That is, within the scope of the objective of the present disclosure, all of the components may be selectively combined into at least one and operated. In addition, the terms such as "include", "consist of", or "have" described above mean that the corresponding component may be present unless otherwise stated, and thus should be construed that the terms do not exclude other components, but may further include other components. All terms, including technical or scientific terms, have the same meaning as commonly understood by those skilled in the art to which the present disclosure belongs, unless defined otherwise. Generally used terms, such as terms defined in the dictionary, should be interpreted as being consistent with the contextual meaning of the related art, and should not be interpreted in an ideal or excessively formal meaning unless explicitly defined in the present disclosure.

The above description is merely illustrative of the technical idea of the present disclosure, and those skilled in the art to which the present disclosure belongs may perform various modification and changes within the scope not departing from the essential characteristics of the present disclosure. Accordingly, the embodiments disclosed in the present disclosure are not intended to limit, but to explain the technical idea of the present disclosure, and the scope of the technical spirit of the present disclosure is not limited by these embodiments. The scope of protection of the present disclosure should be interpreted by the claims below, and all technical spirits within the scope equivalent to the scope of the claims should be interpreted as being included in the scope of the claims of the present disclosure.

For example, in the illustrated embodiment, it is disclosed that the heat sink 30 or 130 is installed on one side plate 24 or the bottom plate 123 of the enclosure 20 or 120, but the heat sink 30 or 130 may be installed on the top plate 21 or 121 of the enclosures 20 and 120.

What is claimed is:

1. A submodule comprising:

an enclosure in which parts are installed, and an opening is formed on one outer surface thereof; and a heat sink installed in the opening of the enclosure, having an inner surface inside the enclosure on which at least one of the parts is installed, and the other surface being outside the enclosure, wherein a first terminal for electrical connection with an adjacent submodule is installed on a front plate of the enclosure, and a second terminal is provided on the heat sink, and wherein the opening is formed on a bottom plate of the enclosure to install the heat sink.

2. The submodule of claim 1, wherein a flow path through which cooling fluid flows is formed inside the heat sink, and wherein the flow path communicates with the outside through an inlet and an outlet installed at one side of the heat sink.

3. A submodule comprising:

an enclosure having a hexahedral shape in which parts are installed therein and an opening is formed on one outer surface thereof; and a heat sink installed in the opening of the enclosure, having an inner surface inside the enclosure on which at least one of the parts is installed and forming an outer surface of one side of the enclosure, wherein a flow path through which cooling fluid flows is formed inside the heat sink, and the flow path communicates with the outside through an inlet and an outlet installed at one side of the heat sink, wherein a first terminal for electrical connection with an adjacent submodule is positioned on a front plate of the enclosure, and a second terminal for electrical connection with an adjacent submodule is positioned on the heat sink, and wherein the opening is formed in any one of a top plate, a side plate, and a bottom plate of the enclosure, and the heat sink is installed to cover the opening to form one outer surface of the enclosure.

* * * * *